United States Patent [19]
Goins, III

[11] Patent Number: 5,874,323
[45] Date of Patent: Feb. 23, 1999

[54] METHOD OF PROVIDING ELECTRICAL CONTACT TO COMPONENT LEADS

[75] Inventor: Fred A. Goins, III, Boise, Id.

[73] Assignee: MCMS, Inc., Nampa, Id.

[21] Appl. No.: 919,536

[22] Filed: Aug. 28, 1997

[51] Int. Cl.[6] .......................... H01L 21/44; H01L 21/48; H01L 21/50
[52] U.S. Cl. .................... 438/121; 438/123; 257/692
[58] Field of Search ................ 438/4, 123, 380, 438/121, 125; 361/728; 174/52.4; 257/684, 692, 693, 694, 695, 696, 697

[56] References Cited

U.S. PATENT DOCUMENTS

| | | |
|---|---|---|
| 4,089,575 | 5/1978 | Grabbe . |
| 4,155,615 | 5/1979 | Zimmerman, Jr. et al. . |
| 4,222,622 | 9/1980 | Griffin et al. . |
| 4,941,832 | 7/1990 | Korsunsky et al. . |
| 4,959,029 | 9/1990 | Grabbe . |
| 4,995,816 | 2/1991 | Grabbe . |
| 5,007,844 | 4/1991 | Mason et al. . |
| 5,055,972 | 10/1991 | Atoh . |
| 5,177,671 | 1/1993 | Atoh . |
| 5,249,971 | 10/1993 | Lai et al. . |

FOREIGN PATENT DOCUMENTS

| | | |
|---|---|---|
| 0015585 | 1/1990 | Japan . |
| 405006787 A | 1/1993 | Japan . |

*Primary Examiner*—John F. Niebling
*Assistant Examiner*—Josetta I. Jones
*Attorney, Agent, or Firm*—Knobbe, Martens, Olson & Bear, LLP

[57] ABSTRACT

A method of providing electrical contact between an external contact element and an electrical lead of a component includes the act of inserting the electrical component into a carrier socket having a housing and a cavity within the housing for receiving the electrical component. The method further includes electrically connecting the electrical lead and a first electrically conductive member, wherein the first conductive member includes a portion which extends into the cavity so as to make electrical contact with the electrical lead; securing the electrical component within the cavity; and electrically connecting the first conductive member to a second electrically conductive member, wherein the second conductive member includes a portion which extends outwardly from the housing so as to make electrical contact with the external contact element.

17 Claims, 7 Drawing Sheets

METHOD OF PROVIDING ELECTRICAL CONTACT TO COMPONENT LEADS

FIELD OF THE INVENTION

The invention relates to the process of inserting integrated circuit (IC) chips into printed circuit boards (PCBs). More particularly, the invention relates to a method and apparatus for salvaging and using ICs having damaged pins, or leads, in a circuit.

BACKGROUND OF THE INVENTION

In the surface mount board manufacturing industry, high speed automated placement machines are used to place surface mount components onto bare PCBs. To accomplish this process, parts are first received from a manufacturer in one of several mediums, including 1) loose parts in a tube; 2) parts in a tape and reel; and 3) parts trays. These parts are extracted from their packaging mediums and then loaded into a placement machine which automatically places them onto the PCB. Prior to placement, the leads of each part are inspected by a machine vision system of the placement machine.

Typical machine vision systems have a back-lighting system, which shines light on a component or part, and a camera which views the illuminated component from a bottom perspective of the component. The light and the component produce a grey-scale image as a result of the shadows produced by the component. This grey-scale image is translated into black or white pixels within the camera. If a lead of the component is bent or damaged, improper pixels will either be black or white, which is detected by the machine vision system. The configuration of black and white pixels produced by an undamaged component is stored within a memory of the machine vision system. The pixel configuration produced by a component being inspected is compared to this "true" pixel configuration and if a mismatch occurs, the component is designated as not passing the visual inspection and is rejected by the automatic placement machine. Of course, machine errors can also cause a component to be rejected. Such automated placement machines, as well as their vision systems, are well-known in the art.

If a part passes the inspection, placement coordinates are calculated, and the part is then placed onto the PCB. If a part is rejected, it is typically taken out of the machine manually and placed into a medium with other damaged parts. During their loading and unloading from the automatic placement machine, parts can be easily damaged. This is particularly true of fine pitch components whose leads are extremely thin and frail, sometimes less than 20 mils thick. The machine vision system will not allow the machine to place these damaged parts. Although these parts can sometimes be fixed manually using tweezers or other tools, often their leads are bent too severely to permit their repair using such devices. These unrepairable parts are then typically destroyed.

The destruction of these fine pitch parts can be very costly to the manufacturer, since fine pitch components may be worth hundreds or even thousands of dollars each. When high numbers of components are damaged through shipping, manufacturing, or mishandling, a sizable amount of profit can be destroyed. Therefore, a method and apparatus for reclaiming, or salvaging, and using damaged fine pitch components is needed.

SUMMARY OF THE INVENTION

The invention addresses the above and other needs by providing an apparatus for reclaiming damaged components, such as integrated circuits (ICs), having damaged or broken leads. In particular, the invention comprises a means by which damaged or broken leads can be detected during the assembly process and the IC can be salvaged by clipping its leads and placing the damaged component into a carrier socket designed for receiving the damaged component. This socket/component assembly may then be placed onto a PCB such that the component may function for its intended purpose. By reclaiming damaged components using the invention, not only is the cost of the component saved, but also the amount of lost time waiting for delivery of new parts is eliminated.

In one embodiment, a method of electrically connecting an electrical component to a printed circuit board, includes: inserting the electrical component into a carrier socket having a housing and a cavity within the housing for receiving the electrical component; electrically connecting the electrical component to a first electrically conductive member, wherein a portion of the first conductive member extends into the cavity so as to make electrical contact with an electrical lead of the electrical component; and electrically connecting the first conductive member to a second electrically conductive member which is at least partially secured within the housing and has a foot portion which extends outwardly from the housing.

In another embodiment, the method as described above further includes electrically connecting the foot portion of the second electrically conductive member to the printed circuit board.

In a further embodiment, the methods as described above further include clipping the electrical lead so that only a portion of the lead remains, wherein the first electrically conductive member makes electrical contact with the remaining portion of the lead.

In another embodiment, a method of electrically connecting an external contact element and a lead portion extending outwardly from an electrical component, includes: clipping an electrical lead of the component such that the lead portion comprises a section of the electrical lead remaining after another portion of the lead has been removed; inserting the electrical component into a carrier socket having a housing and a cavity within the housing for receiving the electrical component; electrically connecting the lead portion and a portion of a contact wheel which extends into the cavity, wherein the contact wheel is electrically coupled to a foot portion which extends outwardly from the housing of the carrier socket; and electrically connecting the foot portion and the external contact element.

In a further embodiment, the method as described above further includes: engaging a first hook, coupled to the contact wheel, with a bottom surface of the electrical component, wherein the contact wheel rotates as the bottom surface exerts a downward force on the first hook as the electrical component is inserted into the cavity; engaging a top surface of the electrical component with a second hook which is coupled to the contact wheel, wherein the second hook engages the top surface as the contact wheel rotates and exerts a downward force on the top surface to secure the electrical component within the cavity.

DETAILED DESCRIPTION OF THE INVENTION

The invention is described in further detail below with reference to the Figures, wherein like elements are referenced by like numerals throughout.

Figure 1:
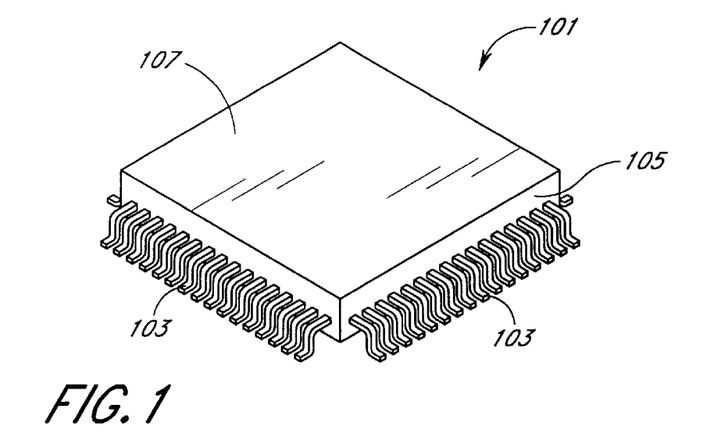
FIG. 1 is a perspective view of a typical fine pitch integrated circuit (IC).

Referring to FIG. 1, a typical fine pitch integrated circuit (IC) 101 is shown. The IC 101 includes multiple fine pitch leads 103 extending outwardly from each side surface 105 of the IC body 107. As the industry is moving toward the integration of more and more components into an IC package, it is moving toward finer pitch packages having pin counts of 100 or more. With the trend toward larger pin count packages, lead pitches have decreased in order to preserve real estate efficiency on a printed circuit board (PCB). With the increase in usage of application specific integrated circuit (ASIC) devices, for example, finer pitch devices have become very common.

One inherent disadvantage of using fine pitch components, such as those described above, is the increased delicacy with which these components must be handled. Because they are so fragile, the leads of these components are easily bent or otherwise damaged during the assembly process.

Figure 2:
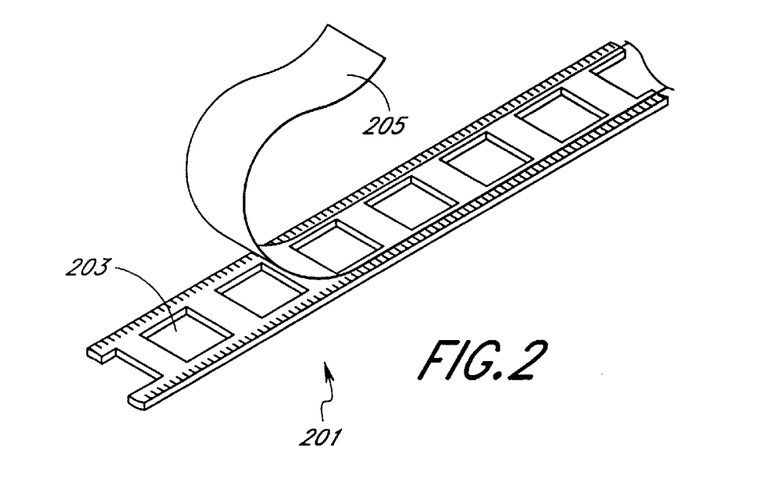
FIG. 2 is a perspective view of a typical packaging format in which components are received in a tape which has cavities therein for receiving the components.

FIG. 2 shows a typical packaging format, called a "parts tape" 201 in which fine pitch components may be received prior to their assembly on the PCB. As shown in FIG. 2, the parts tape 201 is of sufficient thickness that it includes cavities 203 therein for storing a fine pitch component (not shown). These components are sealed or encapsulated within the cavities 203 by means of a cover tape 205, typically made of a plastic or other cellophane-type material. The parts tape 201 is typically wrapped around a reel (not shown).

Figure 3:
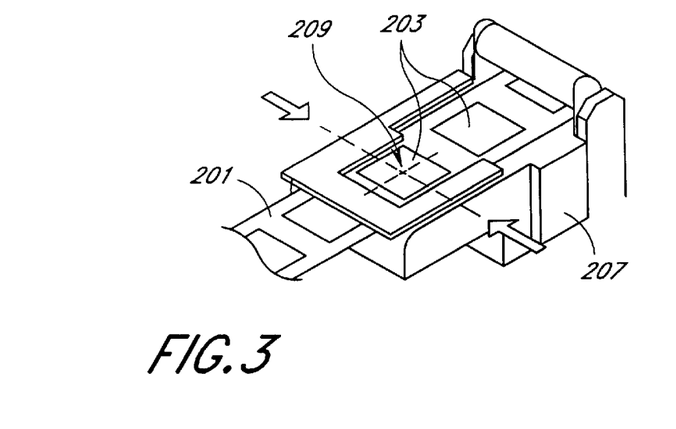
FIG. 3 is a perspective view of a feeder apparatus through which the parts tape of FIG. 2 is fed in order to extract a component from the tape.

FIG. 3 shows the parts tape 201 of FIG. 2 being fed through a feeder 207. As the parts tape 201 moves through the feeder 207, a component (not shown) within a cavity 203 of the parts tape 201 reaches a pickup point 209 where the component is extracted from the tape 201 either manually or automatically by a component placement machine.

Figure 4:
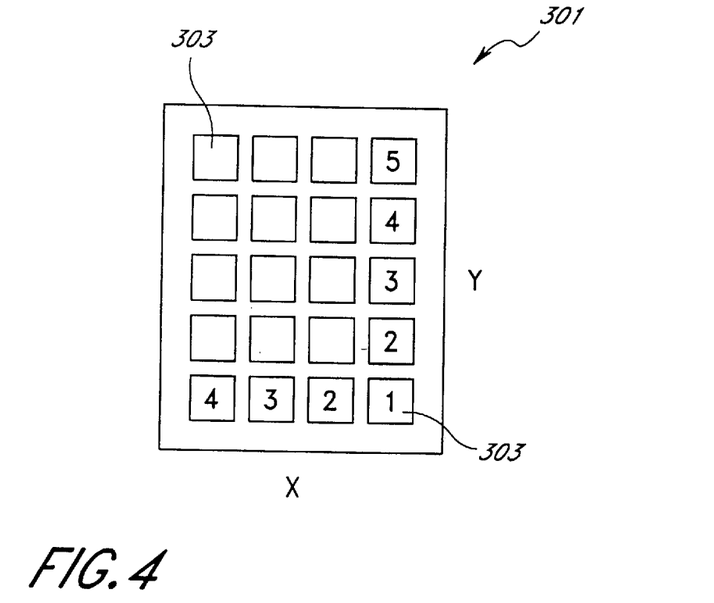
FIG. 4 is a top view of a tray having a packaging format such that components are stored within cavities of the tray.

FIG. 4 shows another typical packaging format, called a "parts tray" 301 in which components are received. This tray 301 includes receptacles, or cavities 303, each of which contain a single component (not shown). The number of rows and columns of cavities 303 are typically input into an automatic placement machine (not shown). This information aids the placement machine in establishing the number and position of components within the tray 301, and in determining their spatial relationships. By determining the spatial relationships between each of the cavities 303, the placement machine can calculate the x-y coordinate positions of all the components within the tray 301 after receiving the x-y coordinates of a first component which is input by an operator.

Figure 5:
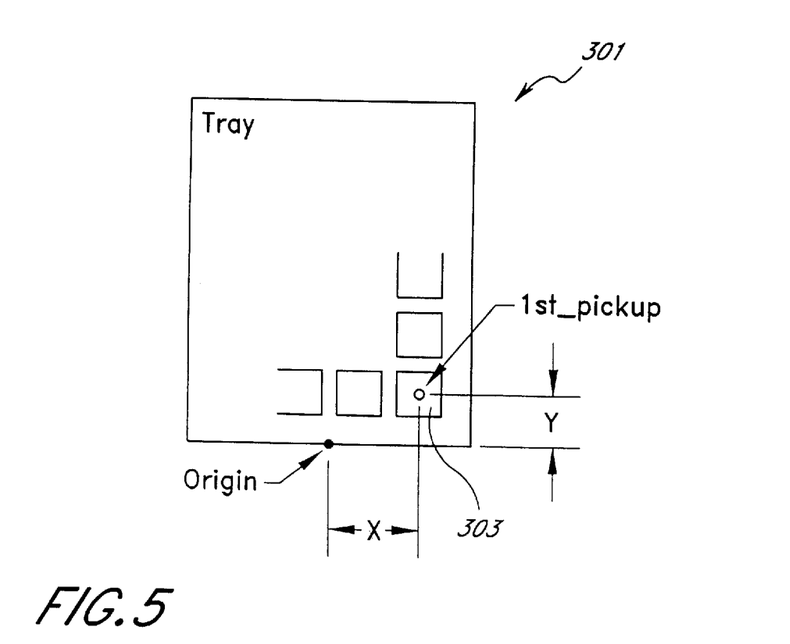
FIG. 5 is a top view of the parts tray of FIG. 4, showing the x-y coordinates of a particular cavity of the tray with respect to an origin.

FIG. 5 shows the x-y coordinates of a first cavity of the tray 301 shown in FIG. 4, with respect to an origin. By referencing the dimensions of the tray 301 and also the dimensions of each cavity 303 within the tray 301, the automatic placement machine can calculate the x-y coordinate position of each component with respect to a specified origin, and thereby accurately make contact with a desired component within each cavity and remove it from the respective cavity 303 of the tray 301. This process of automatically retrieving components based on calculated x-y coordinate positions, as well as the automatic placement machines which perform this process, are well-known in the art.

These automatic placement machines typically include a processor for processing input coordinates in order to accurately determine the position of components during their retrieval from a specified packaging medium, e.g., the parts tape or parts tray format. These placement machines can also calculate the position in which these components are to be placed on a PCB. These placement machines also typically include a controller for controlling a robotic mechanism which picks up each component and then places the component onto the PCB. In one embodiment, the robotic mechanism includes a vacuum nozzle for picking up a specified component by means of vacuum suction, carrying the component to a specified location on a PCB, and thereafter placing the component onto the PCB. For example, if fine pitch components are received in the tray packaging format, an operator typically inputs the x and y position coordinates of one or more parts contained within a tray. The processor then calculates the coordinates of each component within the tray and directs the movement and operation of the vacuum pickup nozzle.

The automatic placement of a part onto a PCB may be accurate to within fractions of a millimeter of a specified target location. This accuracy is accomplished by a machine vision system which looks for two fiducial coordinates, which are typically actual pads positioned on the PCB. The placement machine then aligns each part or component to be placed on the PCB in relation to these fiducial coordinates. Such automatic placement machines, and their corresponding vision systems, are well known in the art, and in the preferred embodiment, a Fuji automatic placement machine, model IP2 or IP3, is used.

Figure 6A:
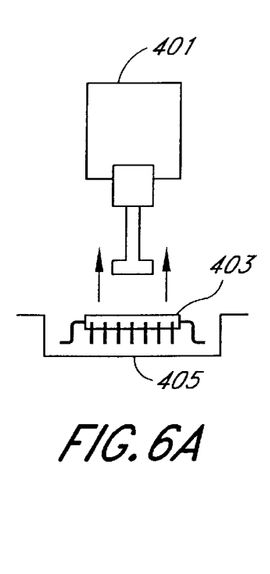
FIGS. 6A–6E illustrate a process flow diagram representing the operation of an automatic placement machine operated in accordance with the invention.
Figures 6B, 6C:
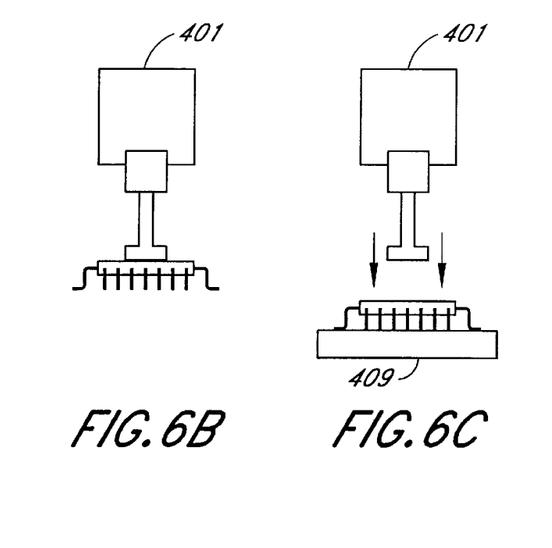
Figure 6D:
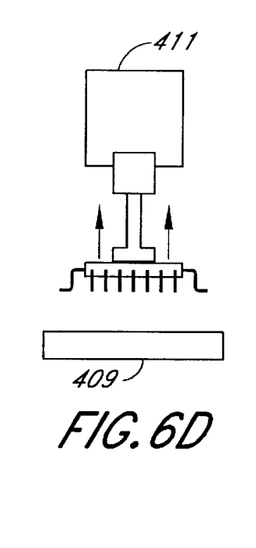
Figure 6E:
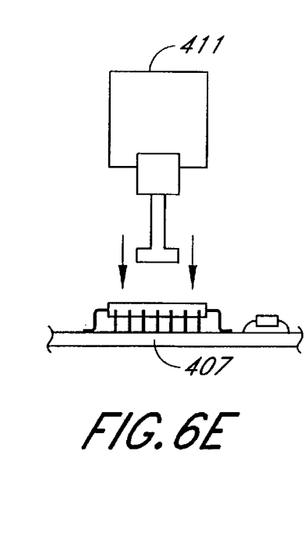

FIG. 6, consisting of FIGS. 6A–6E, illustrates the process of retrieving a component from either a tray or parts tape format by means of a vacuum pickup nozzle 401. In FIG. 6A, the vacuum nozzle 401 is positioned above a desired component 403, in accordance with the coordinates of the component calculated by the placement machine. In FIG. 6B, the vacuum pickup nozzle 401 initiates its vacuum suction mechanism and thereby lifts the desired component 403 out of the cavity 405 of the tray or tape. If the distance between the location where a component is picked up and where it is placed onto the PCB 407 is relatively far with respect to the range of motion of the vacuum pickup nozzle 401, then the component may be placed on a shuttle 404 (FIG. 6C) for transporting the component to the vicinity in which it is to be placed on the PCB 407. Thereafter, a second vacuum pickup nozzle 411 retrieves the component from the shuttle 409 (FIG. 6D) and places the component onto the desired location on a designated PCB 407 (FIG. 6E). The use of a shuttle in Steps 6C and 6D is only necessary when the desired component needs to be transported to a designated PCB which is located relatively far away from the site on the packaging format from which the component is initially retrieved.

Figure 7A:
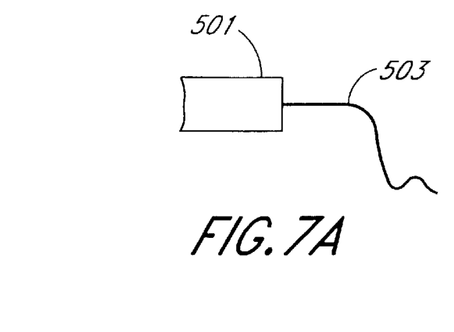
FIGS. 7A–7G comprise a process flow diagram representing one method of clipping the leads of a fine pitch component and then modifying the remaining portion of the leads of the component using a modification tool.
Figure 7B:
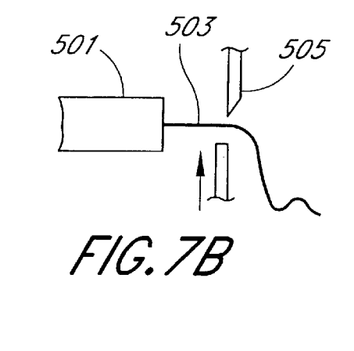

FIGS. 7A–7G illustrate the process steps for preparing the leads of a damaged component so that it may be placed into a carrier socket and salvaged in accordance with the present invention. FIG. 7A shows a component 501 having a damaged lead 503. As shown in FIG. 7B, the damaged lead 503 is clipped by a clipping mechanism 505. As can be readily envisioned, the clipping mechanism 505 may be either a manually operated clipper which has two opposing blades that mechanically cooperate in order to cut one or more leads of a component, or a clipping machine that automatically positions and clips the leads of the component, if a relatively larger number of components are to be modified, in accordance with the invention. In one embodiment, a HEPCO model 3000-2 clipping machine is used. The HEPCO 3000-2 is a pneumatically operated machine and has one fixed die block and a moving blade. The leads of the component are inserted into holes in the die block and extend through the holes such that a portion of each lead emerges from the holes at the opposite end from where the leads were inserted. The portions of the leads which extend beyond the holes are then removed by the moving blade which shears, or cuts, the excess lead material at the point where it emerges from the holes of the die block.

Figure 7C:
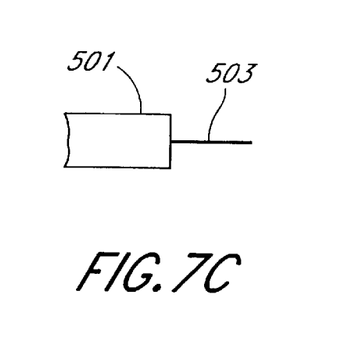

FIG. 7C shows the resultant component 501 with a remaining portion of the clipped lead 503 extending outwardly from the component. In one embodiment, all the leads of the damaged component body are clipped using the clipping apparatus 505 of FIG. 7B. After all of the leads of the component 501 have been clipped, the component 501 is ready to be inserted into a carrier socket (not shown) such that the remaining portion of each clipped lead makes electrical contact with a corresponding contact element (not shown) of the socket. The insertion process and relative configuration of the component and carrier socket are more fully described hereafter with reference to FIGS. 9–11.

Figure 7D:
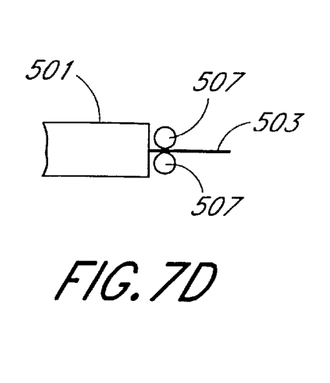
Figures 7E, 7F, 7G, 8:
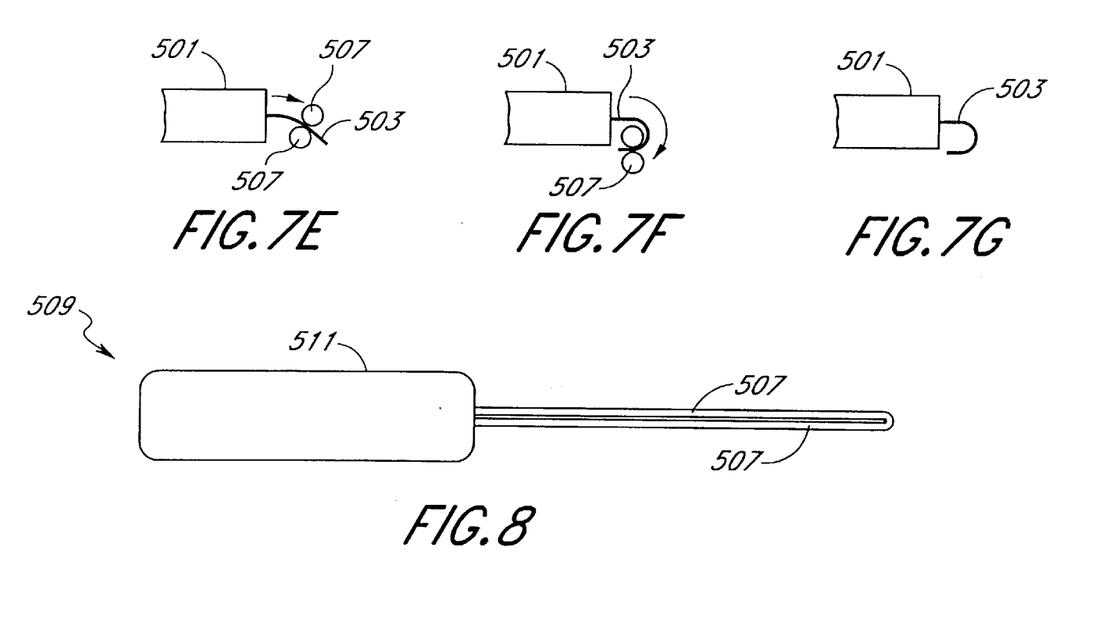
FIG. 8 is a side view of a manual modification tool which can be used to modify the remaining portion of a lead in accordance with the process illustrated in FIGS. 7A–7G.

In one embodiment, after the leads of a damaged component have been clipped, the remaining portions of the leads are further modified by placing one or more of the leads of the component between two spherical, parallel rods 507 (FIG. 7D). By rotating the upper spherical rod about the lower spherical rod in a clockwise direction, as shown in FIGS. 7E and 7F, the remaining portion of the clipped leads are bent such that they curve inwardly toward the component body. FIG. 7G shows the component 501 and corresponding leads 503 after the leads have been modified.

FIG. 8 shows a manual modification tool 509 used to bend the remaining portion of the clipped leads 503 as described above. This modification tool 509 includes a handle 511 and two spherical, parallel rods 507 extending outwardly from one side of the handle 511. The remaining portions of the clipped leads 503 are inserted between the parallel rods 507 and the modification tool 509 is then rotated clockwise, or counterclockwise, in order to bend the remaining portion of the leads 503 into a desired configuration. The leads 503 wrap around one of the parallel rods 507 as the other parallel rod 507 pushes the leads 503 around the first parallel rod 507. After the remaining portion of the clipped leads have been modified by the modification tool 509, the component 501 may be inserted into a carrier socket (not shown) having contact elements, each of which make electrical contact with a corresponding modified remaining portion of the leads. The design of a chip carrier socket which may be used in accordance with the invention is discussed in further detail below with reference to FIGS. 9–11.

Figure 9:
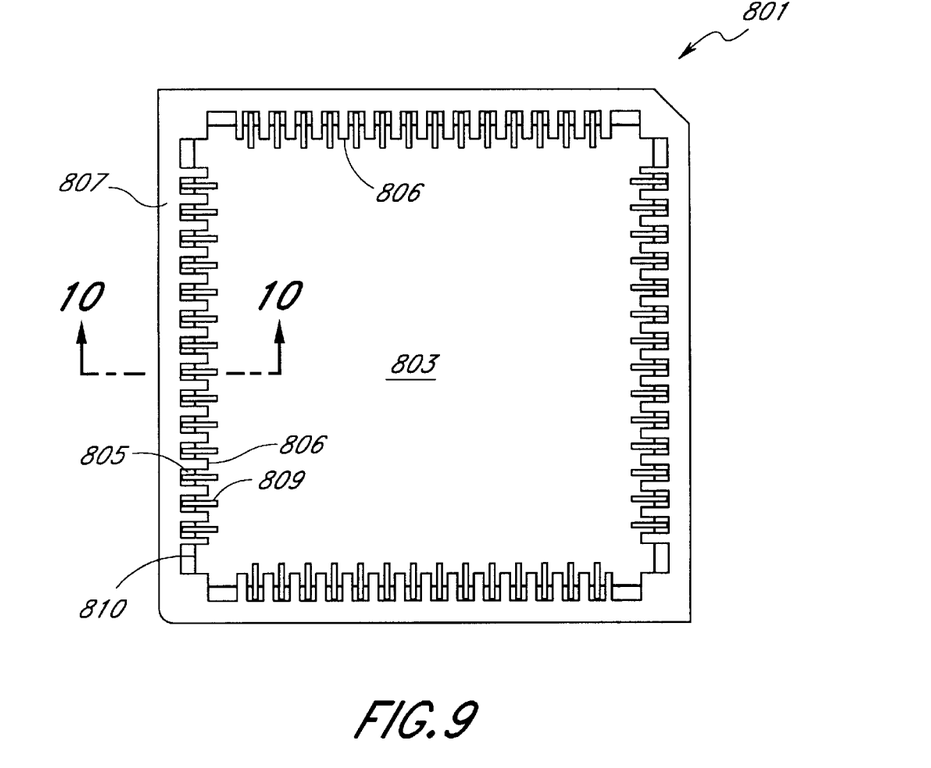
FIG. 9 is a top plan view of one embodiment of a chip carrier socket designed for receiving an IC chip having its leads clipped in accordance with the invention.

Referring to FIG. 9, a top plan view is presented of a chip carrier socket 801 designed for receiving a modified, damaged IC in accordance with the invention. The chip carrier socket 801 includes a cavity 803 for receiving an IC and a plurality of channels 805 positioned on the inside surface of side walls 807 which extend about the periphery of the socket 801 so as to define the cavity 803 within the side walls 807. The channels 805 are formed between channel walls 806 which extend from side walls 807 inwardly toward the cavity 803. Within each channel 805 is an electrically conductive contact wheel 809 comprising a circular disk which is configured to make electrical contact with a corresponding clipped lead of the IC. Each contact wheel 809 rotates about an axis rod 810 which serves as a common axis of rotation for the contact wheels 809. The axis rod 810 passes through holes located at the center of each contact wheel 809 and also passes through holes located on the channel walls 806. Since each of the contact wheels 809 must be insulated from one another the axis rod 810 must be made of a non-conductive material such as plastic or other suitable material.

Figure 10:
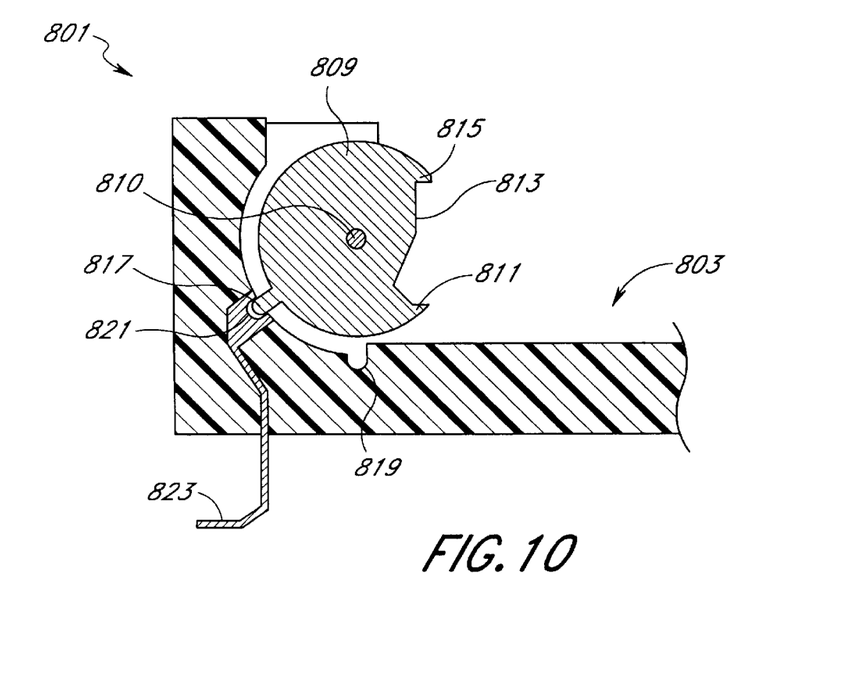
FIG. 10 is a cross-sectional view, taken along lines 10—10 of the chip carrier socket of FIG. 9.

FIG. 10 shows a cross-sectional view, taken along lines 10—10 of FIG. 9, illustrating a contact wheel 809 of the chip carrier socket 801. The contact wheel 809 includes a bottom hook 811 for making initial contact with an IC as it is inserted into the cavity 803. When the bottom hook 811 is pushed downward, the contact wheel 809 rotates about an axis rod 810. The operation of the socket 801 as it receives an IC having clipped leads is described in further detail below with reference to FIGS. 11A–11C. The contact wheel 809 also includes a contact surface 813, for making electrical contact with a clipped lead of an IC, and a top hook 815 for making contact with a top surface of the IC package in order to hold the IC within the cavity 803. The contact wheel 809 further includes a snap-fit nipple 817 which snaps into grooves 819 and 821 located in the interior walls of the socket 801 so as to hold the wheel in either an "open" position when no IC is being received, or a "closed" position when securing an IC. In the open position, the nipple 817 is positioned in groove 819. When an IC is inserted into the socket 801, thereby rotating the contact wheel 809, the top hook 815 pushes down on the top surface of the IC package and "locks" the IC in the cavity 803 of the socket 801 as the snap-fit nipple 817 snaps into groove 821.

As is well-known in the art, the snap-fit operation is accomplished by frictional forces between the snap-fit nipple 817 and the grooves 819 and 821. When the nipple 817 is positioned into one of the grooves 819 or 821, a certain amount of force is required to move the nipple 817 out of the groove 819 or 821. In one embodiment, the amount of force required to remove the nipple 817 from a groove 819 or 821 is relatively small so as to allow the contact wheel 809 to be rotated from the open position to the closed position, and vice versa, with relative ease by a human operator. When the contact wheel 809 is rotated from the open position to the closed position, for example, the nipple 817 must move out of the groove 819 and into the groove 821. As the contact wheel 809 is rotated, the axis rod 810 will flex slightly, thereby allowing the contact wheel 809 to move away from the groove 819 so that the nipple 817 can move out of the groove 819 to be released. The contact wheel 809 is then free to rotate to a closed position wherein the nipple 817 is "snapped" into the groove 821.

When the nipple 817 is positioned within the groove 821, a conduction path is formed between the contact wheel 809 and a foot portion 823. Therefore, by means of the nipple 817 and the groove 821, the contact wheel 809 is rotatably coupled to the foot portion 823. The foot portion 823 is made of an electrically conductive metal and extends downwardly through the body of the carrier socket 801 and outward from a bottom surface of the carrier socket 801 so as to make electrical contact with a pad (not shown) of a PCB. The groove 821 is formed at the end of the foot portion that extends toward the cavity 803, such that when the nipple 817 is positioned within the groove 821, it is secured in contact with the foot portion 823 and a conductive path is formed between the contact wheel 809 and the pad of the PCB via the foot portion 823.

Figure 11A:
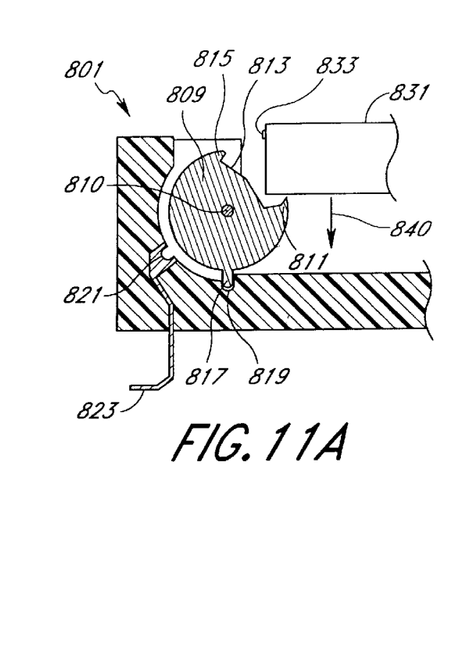
FIGS. 11A–11C comprise a process diagram illustrating how a damaged component, having clipped leads, is inserted into the chip socket of FIG. 9 such that the clipped leads make firm electrical contact with corresponding contact elements of the chip socket.
Figure 11B:
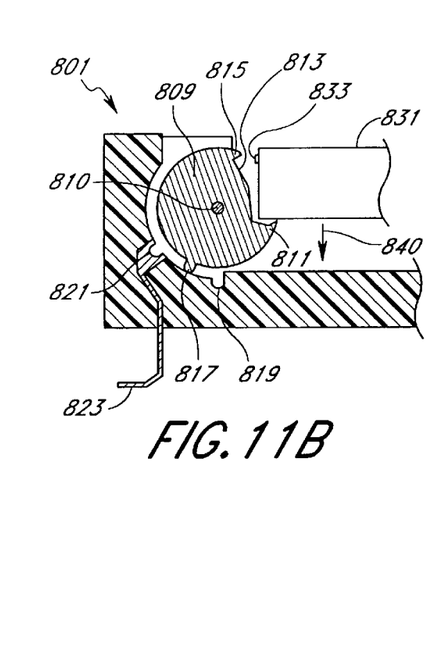
Figure 11C:
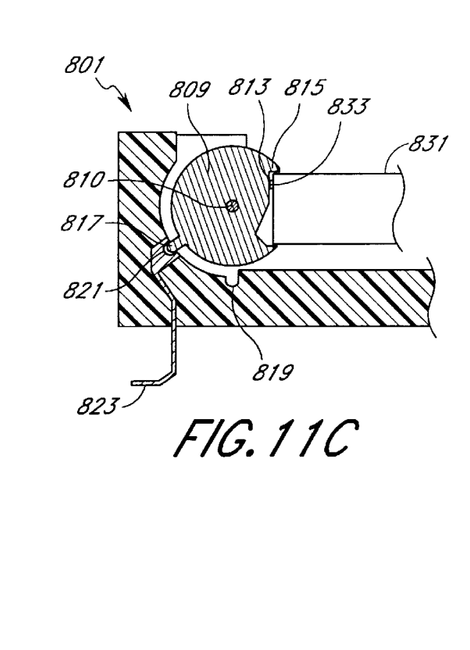

FIGS. 11A–11C illustrate the operation of the carrier socket 801 as an IC 831 having a clipped lead 833 is inserted into the socket. Referring to FIG. 11A, as the IC 831 is inserted into the socket 801 the IC 831 is moved downwardly in the direction of arrow 840, and makes initial contact with the bottom hook 811 of the contact wheel 809. Referring to FIG. 11B, as the IC 831 is pushed further downwardly into the socket 801, the contact wheel 809 rotates about the axis rod 810, and the snap-fit nipple 817 moves away from the groove 819 and toward groove 821. Referring to FIG. 11C, when the IC 831 is completely positioned within the socket 801, the top hook 815 is pressed down onto the top surface of the IC 831, thereby holding it firmly within the cavity 803 (FIG. 9) of the socket 801. The snap-fit nipple 817 is positioned within the groove 821 of the foot portion 823 such that a conduction path is formed between the contact wheel 809 and the foot portion 823. In this position, the clipped lead 833 of the IC 831 is in secure electrical contact with the contact surface 813 of the contact wheel 809. Therefore, when the carrier socket 801 is placed onto a PCB such that the foot portion 823 makes electrical contact with a designated pad on the PCB, an electrical connection is made between the pad of the PCB and the clipped lead 833 of the IC 831. In one preferred embodiment, the foot portions 823 of the carrier socket 801 have the same "foot print" as the leads of an undamaged IC. Thus, the carrier socket 801 may be placed on the same PCB designed for receiving the undamaged IC.

Figure 12:
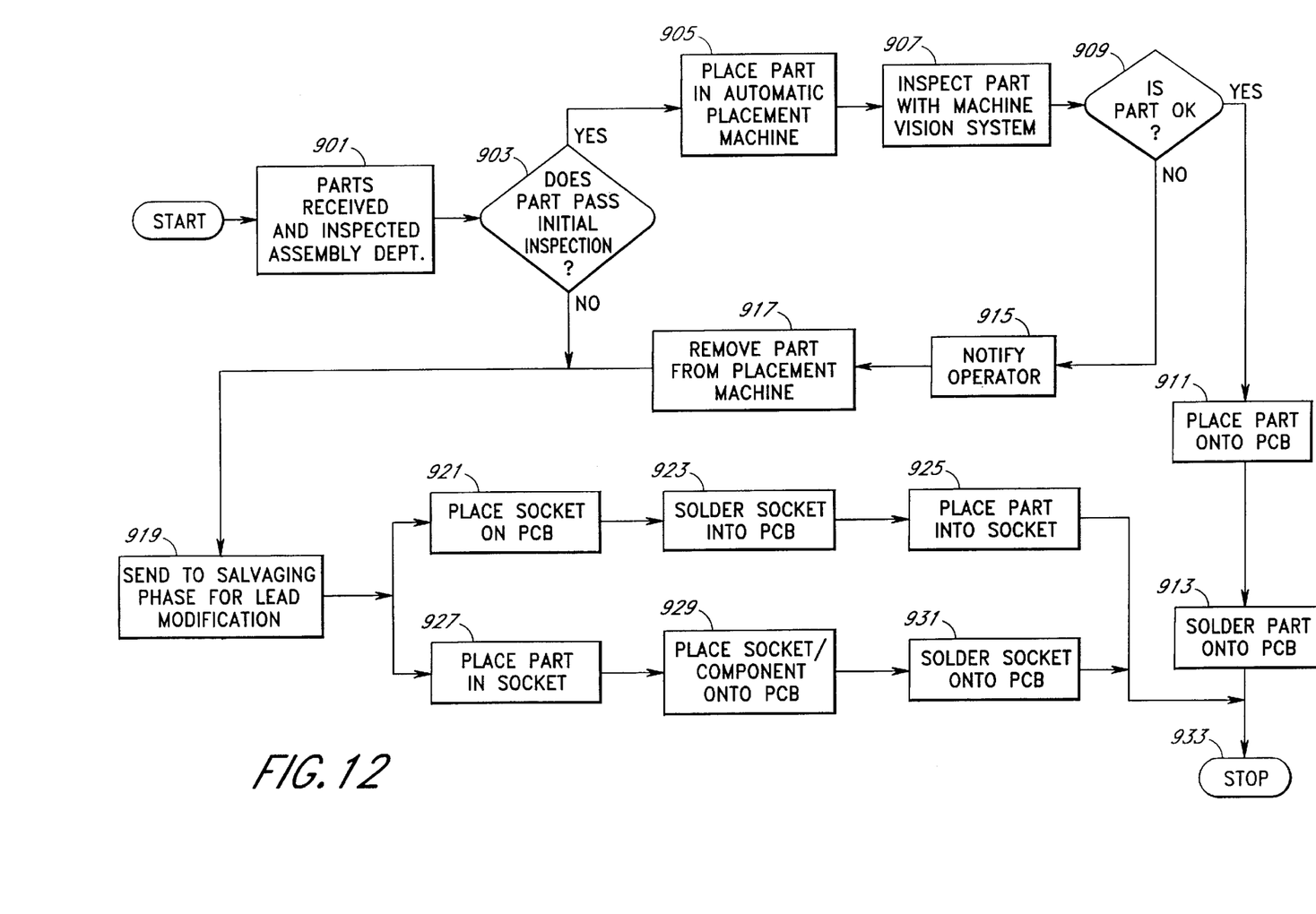
FIG. 12 is a flow diagram illustrating an embodiment of the component salvaging process of the invention.

FIG. 12 shows a flowchart illustrating the process for salvaging damaged components to be placed on a PCB, in accordance with the invention. In step 901, parts are received and initially inspected by an operator. In step 903, the operator determines whether each part has passed the initial inspection. In step 905, wherein the part is placed into an automatic placement machine. In step 907, the component is then inspected by a machine vision system for further defects. In step 909, the machine vision system then determines whether the part is in conformance with specified quality control requirements. With the aid of their vision systems, these automatic placement machines can accurately place a component within 0.01 millimeters from its desired location, as well as detect defects in the components, e.g., bent or damaged leads. In the preferred embodiment, the automatic placement machine is the FUJI IP2 or IP3.

If the machine vision system determines that the part meets specified quality control requirements the process moves to step 911, wherein the placement machine places the part onto a designated location on the PCB. In step 913, the part is soldered onto the PCB using one of many well-known techniques of soldering, such as forced air convection soldering, or infrared heat soldering, etc. If the machine vision system indicates a defect in the component in step 909, e.g., bent leads, the process moves to step 915 wherein the automatic placement machine notifies the operator that the component is defective. Thereafter, in step 917, the placement machine or the operator unloads the part from the placement machine. The part is then sent to the salvaging phase in step 919, where its leads are modified as described above with reference to FIGS. 7A–7G. Note that if the part has not passed the initial manual inspection of step 903, the process moves immediately to step 919 wherein the part is sent to the salvaging phase for lead modification rather than being placed in the automatic placement machine in step 905.

After the leads of the component are prepared in the salvaging phase, the component may follow one of two assembly routes. In one route, a method is used which is adapted for mass assembly of salvaged components. The process proceeds to step 921, wherein an empty chip carrier socket is first placed onto a designated location on a PCB and then, in step 923, is soldered onto the PCB. Thereafter, in step 925, the salvaged component is placed into the socket. In an alternate route, a method is used which is adapted for limited assembly of salvaged components onto a PCB. This route begins in step 927, wherein the component is placed into the chip carrier socket. Thereafter, in step 929, the component/socket assembly is placed onto the designated position of the PCB. The socket is then soldered onto the PCB in step 931. The entire process above is completed when it reaches step 933.

In view of the above, it can be appreciated that the invention provides a solution to a long-standing problem associated with the electronics industry by providing a method and apparatus for salvaging and using components, particularly fine-pitch integrated circuits, having damaged leads. Previously, such damaged components were destroyed resulting in high financial losses to manufacturers. By reclaiming damaged components, in accordance with the invention, not only is the cost of the components saved but the amount of lost time waiting for delivery of new parts is eliminated.

The invention may be embodied in other specific forms without departing from its spirit or essential characteristic. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. A method of electrically connecting an electrical component having at least one electrical lead to a printed circuit board, comprising:

clipping at least one electrical lead of the electrical component so that only a portion of the at least one electrical lead remains;

inserting the electrical component into a carrier socket having a housing and a cavity within the housing for receiving the electrical component;

electrically connecting the electrical component to a first electrically conductive member, wherein a portion of the first conductive member extends into the cavity so as to make electrical contact with the remaining portion of the at least one electrical lead; and electrically connecting the first conductive member to a second electrically conductive member which is at least partially secured within the housing and has a foot portion which extends outwardly from the housing.

2. The method of claim 1 further comprising electrically connecting the foot portion of the second electrically conductive member to the printed circuit board.

3. The method of claim 1 wherein the first conductive member rotatably engages the second conductive member.

4. The method of claim 1 further comprising securing the component within the cavity of the carrier socket.

5. A method of electrically connecting an electrical component to at least one external contact element, comprising:

inserting the electrical component into a carrier socket having a housing and a cavity within the housing for receiving the electrical component;

electrically connecting the electrical component to a first electrically conductive member, wherein a portion of the first conductive member extends into the cavity so as to make electrical contact with an electrical lead of the electrical component; and electrically connecting the first conductive member to a second electrically conductive member which is at least partially secured within the housing and has a foot portion which extends outwardly from the housing, wherein the first conductive member rotatable engages the second conductive member.

6. The method of claim 5 further comprising electrically connecting the foot portion of the second electrically conductive member to the external contact element.

7. The method of claim 5 further comprising clipping the electrical lead so that only a portion of the lead remains, wherein the first electrically conductive member makes electrical contact with the remaining portion of the lead.

8. The method of claim 5 further comprising securing the component within the cavity of the carrier socket.

9. The method of claim 8 wherein the act of securing the electrical component comprises engaging the electrical component with a securing member, coupled to the first conductive member, so as to secure the electrical component within the cavity.

10. The method of claim 9 wherein the securing member of the first conductive member makes contact with a top surface of the electrical component so as to exert a downward force on the component, thereby securing the electrical component within the cavity.

11. The method of claim 10 further comprising engaging a hook member, coupled to the first conductive member, with a bottom surface of the electrical component, thereby causing the first conductive member to rotate about an axis such that the securing member makes contact with the top surface of the electrical component.

12. The method of claim 11 further comprising positioning a holding member, coupled to the first conductive member, within a groove located on the housing of the carrier socket, wherein the first securing member is held in fixed engagement with the top surface of the electrical component when the holding member is positioned within the groove.

13. A method of electrically connecting an external contact element and a lead portion extending outwardly from an electrical component, comprising:

clipping an electrical lead of the component such that the lead portion comprises a section of the electrical lead remaining after another portion of the lead has been removed;

inserting the electrical component into a carrier socket having a housing and a cavity within the housing for receiving the electrical component;

electrically connecting the lead portion and a portion of a contact wheel which extends into the cavity, wherein the contact wheel is electrically coupled to a foot portion which extends outwardly from the housing of the carrier socket; and electrically connecting the foot portion and the external contact element.

14. The method of claim 13 further comprising:

engaging a first hook, coupled to the contact wheel, with a bottom surface of the electrical component, wherein the contact wheel rotates as the bottom surface exerts a downward force on the first hook as the electrical component is inserted into the cavity; and engaging a top surface of the electrical component with a second hook which is coupled to the contact wheel, wherein the second hook engages the top surface as the contact wheel rotates and exerts a downward force on the top surface to secure the electrical component within the cavity.

15. The method of claim 14 further comprising positioning a snap-fit nipple, coupled to the contact wheel, within a groove located on the housing of the carrier socket, wherein the second hook is held in fixed engagement with a top surface of the electrical component when the snap-fit nipple is positioned within the groove.

16. A method of providing electrical contact between an external contact element and an electrical lead of a component, comprising:

clipping the electrical lead of the electrical component so that only a portion of the electrical lead remains;

inserting the electrical component into a carrier socket having a housing and a cavity within the housing for receiving the electrical component;

electrically connecting the electrical component to a first electrically conductive member, wherein the first conductive member includes a portion which extends into the cavity so as to make electrical contact with the remaining portion of the electrical lead; and electrically connecting the first conductive member to a second electrically conductive member, wherein the second conductive member includes a portion which extends outwardly from the housing so as to make electrical contact with the external contact element.

17. The method of claim 16 wherein the first conductive member rotatably engages the second conductive member.

* * * * *